United States Patent
Fujii et al.

(10) Patent No.: US 6,934,920 B2
(45) Date of Patent: Aug. 23, 2005

(54) SPECIMEN ANALYZING METHOD

(75) Inventors: Toshiaki Fujii, Chiba (JP); Masamichi Oi, Chiba (JP); Atsushi Yamauchi, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 322 days.

(21) Appl. No.: 10/130,880

(22) PCT Filed: Oct. 5, 2001

(86) PCT No.: PCT/JP01/08836

§ 371 (c)(1),
(2), (4) Date: Jul. 17, 2002

(87) PCT Pub. No.: WO02/31877

PCT Pub. Date: Apr. 18, 2002

(65) Prior Publication Data

US 2003/0145291 A1 Jul. 31, 2003

(30) Foreign Application Priority Data

Oct. 11, 2000 (JP) ........................................ 2000-310321

(51) Int. Cl.⁷ ........................... G06F 17/50; G06K 9/00; G01N 21/00
(52) U.S. Cl. ............................. 716/4; 716/19; 716/21; 382/149; 356/237.4
(58) Field of Search ................................ 176/4, 19–21; 356/237.1, 237.3, 237.4, 237.5; 700/121; 382/144, 149, 151

(56) References Cited

U.S. PATENT DOCUMENTS

| 5,801,965 A | * | 9/1998 | Takagi et al. ............... 702/35 |
| 5,841,893 A | * | 11/1998 | Ishikawa et al. ........... 382/145 |
| 6,124,142 A | * | 9/2000 | Fujino et al. ............... 438/18 |
| 6,185,325 B1 | * | 2/2001 | Sakaida et al. ............ 382/162 |

FOREIGN PATENT DOCUMENTS

| JP | 07221156 | | 8/1995 | |
| JP | 08124977 A | * | 5/1996 | ........... H01L/21/66 |

* cited by examiner

Primary Examiner—Leigh M. Garbowski
(74) Attorney, Agent, or Firm—Adams & Wilks

(57) ABSTRACT

In a sample analysis method, positional coordinates of reference points on a surface of the sample are measured using a first device. Positional coordinates of an object on the surface of the sample to be analyzed are also measured using the first device. A sample piece containing on a surface thereof a preselected number of the reference points and the object is removed from the sample. The sample piece is then mounted on a second device different from the first device. The positional coordinates of the reference points on the surface of the sample piece are then measured using the second device. The positional coordinates of the object on the surface of the sample piece are then calculated using the positional coordinates of the reference points measured by the second device and the positional coordinates of the object measured by the first device. The object on the surface of the sample piece is then analyzed.

20 Claims, 2 Drawing Sheets

SPECIMEN ANALYZING METHOD

CROSS REFERENCE TO RELATED APPLICATION

This application is a U.S. national stage application of copending International Application No. PCT/JP01/08836, filed Oct. 5, 2001, claiming a priority date of Oct. 11, 2000, and published in a non-English language.

BACKGROUND OF THE INVENTION

1. Technical Field

The present invention relates to a method for subjecting a subject to be measured to treatment such as observation/analysis/processing using a focused ion beam device, etc., based on position information for the subject to be measured constituted by foreign matter on the surface of a sample or defects such as shape abnormalities measured by a foreign matter/defect inspection devices, for example.

2. Background Art

In semiconductor fabrication methods, such as that for semiconductor integrated circuits, in order to improve production yield as the fabrication process is refined and the degree of integration is improved, it becomes a very important problem to prevent foreign matter from being introduced during the fabrication process.

For this purpose, in a fabrication process, a controlling wafer referred to as a control wafer/monitor wafer is introduced into a product wafer and the controlling wafer and the product wafer are then inspected using a foreign matter/defect inspection device immediately after each process or process that is important with respect to control. Defects such as the presence of foreign matter or shape abnormalities found by this inspection process are examined and analyzed so as to specify the cause of the introduction/occurrence. In addition, appropriate measures are taken against any causes to improve reliability of the fabrication process.

Inspection using a foreign matter/defect inspection device is conducted without changing the shape of a sample used for fabrication, because it is also important to learn on which section of the sample a defect is detected.

A dedicated analyzer/measuring device is used for examining and analyzing defects such as the presence of foreign matter or shape abnormalities. A variety of analyzers/measuring devices including a scanning electron microscope and a focused ion beam device with an EDS (Energy Dispersive Spectroscopy) analysis function are used depending on the application.

The position of defects such as foreign matter on the surface of a sample or of shape abnormalities on a semiconductor wafer is measured by a foreign matter/defect inspection device. The confirmed foreign matter or defects such as shape abnormalities are examined and analyzed in detail by a measuring device according to the purpose. For this purpose, it is necessary to mount a sample for which positions are measured using the foreign matter/defect inspection device onto a measuring device, and to move the foreign matter or defects such as shape abnormalities, of which position is measured, to positions where observation and analysis by the measuring device is possible. Along with improvement of semiconductor fabrication technologies, since foreign matter or defects to be measured are becoming smaller and smaller and samples such as semiconductor wafers are becoming larger, it is very difficult to specify the position of foreign matter/defects using a foreign matter/defect inspection device. The shape of a sample or a certain shape on the surface of the sample is made to be a mark, positional coordinates of the mark are confirmed using both a foreign matter/defect inspection device and a measuring device, and coordinate linkage for matching positional coordinates of the sample is performed between a plurality of devices. At this time, the same size of samples can be observed and inspected by a sample stage of both the foreign matter/defect inspection device and the measuring device.

However, since a sample stage of a the foreign matter/defect inspection device or of a measuring device becomes larger as the sample size increase, the entire device becomes larger, causing the footprint of the device to increase. In addition, the device will also become more expensive as it increases in size.

In a particular, when a second device is a focused ion beam device, destructive testing is performed on a surface of a sample using teaching processing, for example. The sample used in testing therefore cannot be returned to the fabrication process. Since the sample is not returned to the fabrication process after such an inspection, the shape of the sample required for a fabrication process does not have to be maintained, and more and more, there is a noticeable need to fully study the necessity of a measuring device for handling large scale samples in terms of cost effectiveness.

SUMMARY OF THE INVENTION

In order to resolve the aforementioned problems, the present invention sets out to provide a compact measuring device for use in the detailed examination and analysis of a small sample.

First, a plurality of reference points observable by both a foreign matter/defect inspection device constituting a first device and a measuring device constituting a second device are prepared on the surface of a sample, and the positions of these points are measured by the first device. Next, foreign matter on the surface of the sample or defects such as shape abnormalities are measured by the first device.

The sample is then divided into a size capable of being mounted on the second device. At this time, a plurality of the reference points, if possible 3 or more, are included on the surface of a divided sample.

The divided sample is mounted on the second device. The positions of the reference points on the divided sample are confirmed using the second device, and based on this position information, the coordinates of only those on the surface of the divided sample are calculated among the foreign matter or the defects such as shape abnormalities measured by the first device.

The sample is moved to the calculated coordinates, and the foreign matter or the defects such as shape abnormalities at the coordinates are observed and analyzed.

DETAILED DESCRIPTION OF THE PREFERRED EMBODIMENTS

Figure 1:
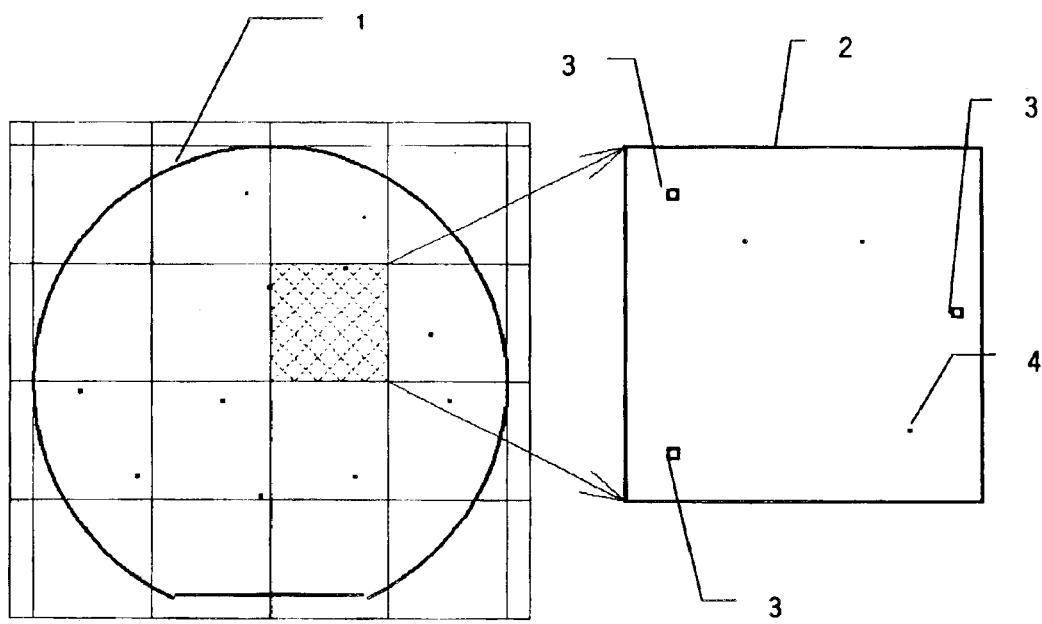
FIG. 1 is an explanatory drawing of the present.

A method f or inspecting defects of the present invention will be described in the following with reference to FIG. 1 and FIGS. 2A–2B.

Firstly, the positions of reference points 3 on a sample such as a semiconductor wafer 1 that has passed through a fabrication process is confirmed.

A typical controlling wafer for a fabrication process (referred to as a control wafer/monitor wafer) is a wafer without specific patterns on the surface of the wafer. In this case, taking into consideration a division method, a mark is created so as to include a plurality of reference points (three or more, if possible) on the divided sample. The shape of the mark is created so as to be capable of observation by either of a foreign matter/defect inspection device constituting a first device 5, or a measuring device constituting a second device 6 by providing step on the surface of the sample. A method to create the step is, for example, carried out by selectively performing etching or deposition onto an arbitrarily shaped area of the surface of the sample. A method for selectively etching on the arbitrarily shaped area includes irradiation with a focused laser beam or ion beam. Further, a method for selectively performing deposition onto the arbitrarily shaped area includes a method for irradiating a focused laser beam or an ion beam in a raw material gas atmosphere. In addition, by scribing on the surface of the sample with a needle etc., scribed marks can be made as reference points.

When there are characteristic patterns, for example integrated circuit patterns, on the surface of the sample to be inspected, easily observable or confirmable patterns of the integrated circuit patterns can be taken to be reference points.

Incidentally, the size of the mark may be as large as being visible to the naked eye. At this time, a characteristic shape in the mark is set to a reference point of a coordinate linkage. By making the mark a size visible to the naked eye, the precise coordinates can be confirmed after narrowing down the positional coordinates by the naked eye when confirming the coordinates of the mark using the second device.

However, if the shape of the mark is large enough to be visible to the naked eye, specified positioning operations sometimes may not be performed depending on the performance of the second device. Therefore, the size of the mark is optimized according to the performance of the device to be used.

Additionally, in the division of the sample described later, when the peripheral position of the divided sample can determine a relative position to the position of foreign matter or defects such as shape abnormalities detected by the foreign matter/defect inspection device, the characteristic shape around the periphery of the divided sample can be substituted for a mark, without specifically creating a mark.

Secondly, the positional coordinates of the reference points 3 at a created or specified mark etc. are measured using the foreign matter/defect inspection device.

Figure 2A:
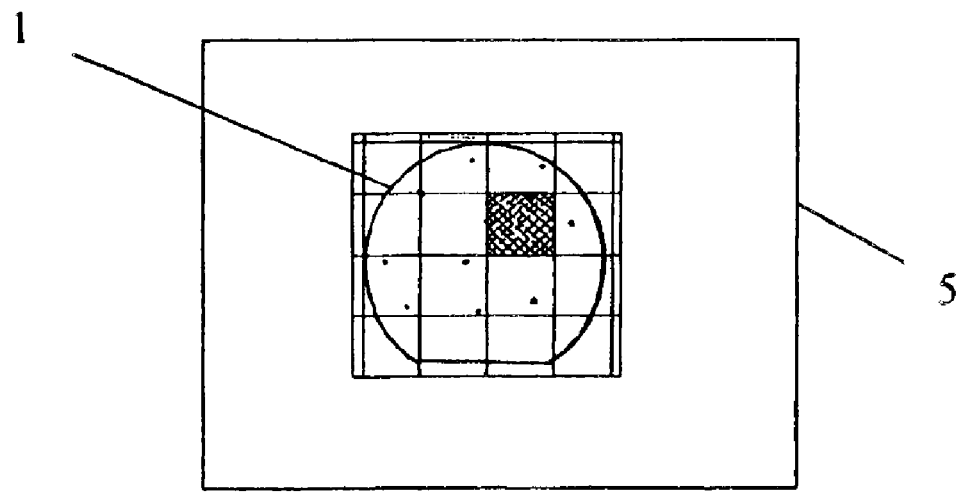
FIGS. 2A–2B are top views showing in block form the first and second measuring devices, respectively.

In a third step, the entire sample is inspected or measured using the foreign matter/defect inspection device 5 shown in block form in FIG. 2A. As a result, the reference points 3 and the positional coordinates of a detected object to be analyzed, such as foreign matter or defects 3, are measured and determined.

At this time, it is also possible to use a fourth step for creating a mark to encompass of foreign matter or defects 4 that are particularly necessary in analysis using the second device, or for specifying reference points.

Figure 2B:
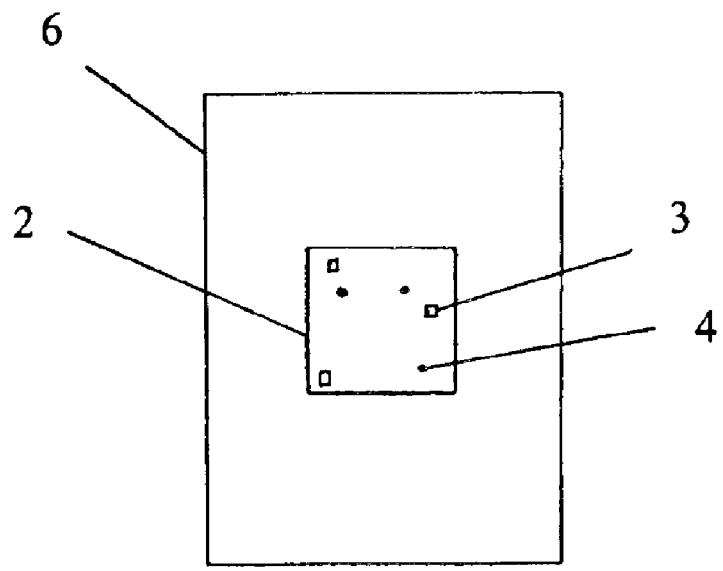

As a fifth step the sample is divided into pieces, of which size is mountable on the second device 6 shown in block form in FIG. 2B. The sample is divided using a device such as a dicing saw, or a cleavage device.

It is also possible to perform cleavage manually. At this time, with regard to a divided sample 2, a plurality of the reference points 3, if possible 3 or more, are made to be included on the surface of the sample to be analyzed by the second device.

As a sixth step, the divided sample 2 is mounted on the second device.

Then, the positional coordinates of a plurality of the reference points 3 are confirmed using the second device.

The positional coordinates of the foreign matter or defects 4 detected by the first device are calculated from the positional coordinates of the plurality of the confirmed reference points 3.

As a seventh step, the foreign matter or the defects such as shape abnormalities 4 of the calculated positional coordinates are observed and analyzed using the second device.

The described above steps are an embodiment of the present invention. The order of the steps for specifying or creating a plurality of reference points for determining subjects to be measured such as defects detected by the first device and their position information after dividing the sample is by no means limited to the method described in the above embodiment.

Incidentally, a plurality of characteristic shapes such as marks in one pattern may be taken as a plurality of reference points. Each reference point of the plurality of reference points must then be set to keep a certain positional relationship so as not to be point-symmetrical with respect to fixed points such as vertexes of a regular polygon. In such an arrangement, since the direction of the sample cannot be specified, for example, if a total of four reference points are provided at respective positions of vertexes of a square, the direction of the mounted sample cannot be identified between when the sample is placed after rotating 90 degrees and when the positional coordinates of the reference point or the positional coordinates of the subject to be measured are originally measured. However, the shape of the divided sample is typically a non-regular polygon. In this case, even if the reference points on the surface of the sample have a regular polygonal relationship, selection of a characteristic shape from amongst the sample outlines as a reference in addition to the reference points on the surface of the divided sample means that this does not cause any problem.

The present invention provides a device for handling a small sample as a second device for conducting detailed examination and analysis regardless of a size of a sample used in the fabrication process.

In this manner, the footprint of the device can be kept small. Since the installation and maintenance cost of a clean room such as a semiconductor fabrication facility is typically expensive, it is preferable that the installation space of a device installed in the clean room is as narrow as possible. If the method of the present invention is used, an increase in installation space in keeping with an increase of a sample size can be limited. In addition, because a device for handling a small sample is less expensive compared to a device for a large sample, the facility purchase cost can be also restrained. Furthermore, as a result of using this method, there is no need to replace the second device even if the size of a sample used in the fabrication process is changed in the future.

What is claimed is:

1. A sample analysis method, comprising the steps of: using a first device to obtain position information for a plurality of reference points on a surface of a sample; using the first device to obtain position information for an object on the surface of the sample to be analyzed; dividing the sample into a plurality of separate sample pieces utilizing the obtained position information for the reference points and the object so that a preselected one of the sample pieces includes the reference points and the object; mounting the preselected sample piece on a second device; measuring a position of each of the reference points on a surface of the preselected sample piece using the second device; specifying the position of the object on the surface of the preselected sample piece using the measured positions of the reference points on the surface of the preselected sample piece and the position information for the object obtained using the first device; and analyzing the object on the surface of the preselected sample piece in accordance with the specified position thereof using the second device.

2. A sample analysis method according to claim 1; wherein the object to be analyzed comprises a foreign matter or a defect on the surface of the sample; and wherein the first device comprises a foreign matter/defect inspection device; and further comprising the step of inspecting the foreign matter or defect on the surface of the sample using the foreign matter/defect inspection device.

3. A sample analysis method according to claim 2; wherein the defect comprises an abnormality in the shape of the sample.

4. A sample analysis method according to claim 1; wherein the second device comprises a measuring device for supporting the preselected sample piece during the mounting step and which is not configured to support any part of the sample prior to the dividing step.

5. A sample analysis method according to claim 4; wherein the second device comprises a focused ion beam device.

6. A sample analysis method according to claim 1; wherein the step of obtaining the position information of the reference points on the surface of the sample using the first device comprises the step of obtaining the position information using patterns formed in advance on the surface of the sample.

7. A sample analysis method according to claim 1; further comprising the step of forming the reference points on the surface of the sample prior to the position information obtaining steps by etching a preselected area of the surface of the sample or by deposition of a material on the preselected area of the surface of the sample.

8. A sample analysis method according to claim 1; further comprising the step of forming the reference points on the surface of the sample prior to the position information obtaining steps by scribing on the surface of the sample to form a plurality of scribed marks.

9. A sample analysis method according to claim 1; wherein the step of obtaining the position information of the reference points on the surface of the sample using the first device comprises the step of obtaining the position information using characteristic shapes of a plurality of isolated patterns formed on the surface of the sample.

10. A sample analysis method according to claim 1; wherein step of obtaining the position information of the reference points on the surface of the sample using the first device comprises the step of obtaining the position information using different characteristic shapes corresponding to a single pattern formed on the surface of the sample.

11. A sample analysis method according to claim 1; further comprising the step of forming the reference points on the surface of the sample prior to the position information obtaining steps so that the reference points are not point-symmetrical with respect to a fixed point on the surface of the sample.

12. A sample analysis method according to claim 1; wherein the dividing step comprises the step of cutting the sample into a plurality of separate sample pieces.

13. A sample analysis method according to claim 12; wherein the cutting step comprises the step of cutting the sample using one of a dicing saw and a cleavage device.

14. A sample analysis method, comprising the steps of:

providing a sample having a surface containing at least one of a foreign matter and a defect to be analyzed;

measuring positional coordinates of a plurality of reference points on the surface of the sample using a first device;

measuring positional coordinates of the foreign matter and/or defect on the surface of the sample using the first device;

removing from the sample a sample piece containing on a surface thereof a preselected number of the reference points and the foreign matter and/or defect utilizing the measured positional coordinates of the reference points and the foreign matter and/or defect measured by the first device;

mounting the sample piece on a second device different from the first device;

measuring the positional coordinates of the reference points on the surface of the sample piece using the second device;

calculating the positional coordinates of the foreign matter and/or defect on the surface of the preselected sample piece using the positional coordinates of the reference points measured by the second device and the positional coordinates of the foreign matter and/or defect measured by the first device; and analyzing the foreign matter and/or defect on the surface of the sample piece in accordance with the calculated positional coordinates of the foreign matter and/or defect.

15. A sample analysis method according to claim 14; wherein the preselected number of the reference points comprises at least three reference points.

16. A sample analysis method according to claim 14; wherein the removing step includes the step of cutting the sample into a plurality of sample pieces.

17. A sample analysis method according to claim 14; wherein the defect comprises an abnormality in the shape of the sample.

18. A sample analysis method according to claim 14; wherein the first device comprises a foreign matter/defect inspection device.

19. A sample analysis method according to claim 14; wherein the second device comprises a focused ion beam device.

20. A sample analysis method according to claim 14; wherein the step of measuring the positional coordinates of the reference points on the surface of the sample using the first device comprises the step of measuring the positional coordinates using at least one pattern formed in advance on the surface of the sample.

* * * * *